United States Patent
Chappaz

(10) Patent No.: US 9,431,973 B2
(45) Date of Patent: Aug. 30, 2016

(54) PULSE-WIDTH MODULATION GENERATOR

(71) Applicant: QUALCOMM TECHNOLOGIES International, Ltd., Cambridge, Cambridgeshire (GB)

(72) Inventor: David Chappaz, Cambridgeshire (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 0 days.

(21) Appl. No.: 14/480,161

(22) Filed: Sep. 8, 2014

(65) Prior Publication Data

US 2016/0072454 A1 Mar. 10, 2016

(51) Int. Cl.
*H03F 3/217* (2006.01)
*H03F 3/183* (2006.01)
*H03K 3/017* (2006.01)

(52) U.S. Cl.
CPC ............. *H03F 3/183* (2013.01); *H03F 3/217* (2013.01); *H03K 3/017* (2013.01); *H03F 2200/03* (2013.01)

(58) Field of Classification Search
CPC .... H03F 3/217; H03F 1/32; H03F 2200/331; H03F 3/183; H03K 3/017
USPC .................. 330/151, 10, 251, 260; 332/110; 341/143, 155, 156
See application file for complete search history.

(56) References Cited

U.S. PATENT DOCUMENTS

| | | | |
|---|---|---|---|
| 7,286,009 B2 * | 10/2007 | Andersen | H03F 1/32 330/10 |
| 7,696,913 B2 * | 4/2010 | Melanson | H02M 1/4225 341/143 |
| 8,766,713 B2 | 7/2014 | Lin | |
| 2009/0027117 A1 | 1/2009 | Andersen et al. | |
| 2009/0027118 A1 | 1/2009 | Andersen et al. | |
| 2010/0079323 A1 | 4/2010 | Miao | |
| 2012/0153917 A1 | 6/2012 | Adell et al. | |
| 2015/0156043 A1 | 6/2015 | Fujino | |

FOREIGN PATENT DOCUMENTS

| | | |
|---|---|---|
| GB | 2452498 A | 3/2009 |
| JP | 2005135520 A | 5/2005 |
| WO | 2006034237 A1 | 3/2006 |

OTHER PUBLICATIONS

International Search Report—PCT/US2015/049017—ISA/EPO—Nov. 17, 2015.
GB Search Report Issued in related GB Application No. 1503923.3, dated Feb. 16, 2016, 1 Page.

* cited by examiner

*Primary Examiner* — Arnold Kinkead
(74) *Attorney, Agent, or Firm* — Procopio, Cory, Hargreaves & Savitch LLP

(57) ABSTRACT

The present application relates to a pulse-width modulation generator for generating a pulse-width modulated signal, the PWM generator comprising: a PWM modulator; and a loop filter, wherein the loop filter is configured to receive an input signal and to output a filtered signal to the PWM modulator, and the PWM modulator is configured to receive the filtered signal from the loop filter and to output a pulse-width modulated signal, the PWM generator further comprising: a feedback loop coupling an output of the PWM modulator to an input of the loop filter, wherein the feedback loop includes a comb filter.

17 Claims, 4 Drawing Sheets

PULSE-WIDTH MODULATION GENERATOR

TECHNICAL FIELD

The present invention relates to a pulse width modulation generator.

BACKGROUND TO THE INVENTION

In recent times class D amplifiers have become popular for use in audio applications, due to their high efficiency in comparison with other classes of amplifier. Class D amplifiers operate by using a modulator to generate a pulse-width modulated (PWM) square wave comprising a high frequency carrier signal modulated by a lower frequency signal (known as the modulating signal) to be output by a suitable output device such as a loudspeaker. This PWM signal is filtered by a low-pass filter to recover the output signal, which is then output to the output device.

One problem that can arise with class D amplifiers, in particular for audio applications, is that generating a PWM signal of sufficiently high quality can be difficult, particularly when implementation constraints such as a low switching frequency in the PWM modulator are imposed.

A popular approach to this problem is to incorporate a noise-shaping loop around the PWM modulator, to improve performance. FIG. 1 is a schematic representation of a PWM generator in which this approach is used.

The PWM generator is shown generally at 10 in FIG. 1, and includes an interpolator 12, which receives at its input a digital signal representing a signal to be output, such as a digital audio signal. In the example shown in FIG. 1, the input signal is a 24-bit signal having a sampling frequency $f_s$.

The interpolator 12 upsamples the input signal and outputs a output signal X(z) having a frequency of $f_w$, which is typically in the range of a few tens of MHz, but which may be over 100 MHz, to a loop filter 14, which has a very large gain at low frequencies (i.e., in the frequency range within which the PWM output must closely match the input audio signal). The operation of the loop filter 14 will be described in more detail below.

The loop filter 14 outputs a filtered output signal U(z) to a PWM modulator 16. The loop filter output signal U(z) is also, in this example, a 24-bit signal having a sampling frequency of $f_w$.

The PWM modulator 16 includes a comparator 18, which compares the signal U(z) input to the PWM modulator 16 with a carrier signal (which is typically a triangle-wave signal for a double-edge PWM modulation or a sawtooth signal for a single edge PWM modulation) of a given frequency, which may be of the order of ten times the highest frequency component of the input signal X(z), and outputs a single-bit pulse-width modulated signal Y(z) having a sampling frequency of $f_w$. The output of the comparator 18 is binary, and the entire PWM modulation process can be modelled as a quantisation noise source generating a noise signal E(z).

The PWM output signal Y(z) is fed back to a combiner 20, where it is subtracted from the interpolated signal X(z) output by the interpolator 12, to compute the difference between the interpolated signal X(z) and the PWM output signal Y(z). The signal output by the combiner 20 that is input to the loop filter 14 includes a low frequency component, due to the input signal X(z) and the low frequency component of the modulated output signal Y(z), and a high frequency component, due to the high frequency carrier signal component of the modulated signal Y(z). Due to the high gain of the loop filter in the lower frequency ranges and as a result of the feedback loop, the output of the PWM modulator Y(z) only contains the low frequency component of the interpolated input signal X(z) and a shaped error signal with a reduced amount of energy in the low frequency range. This can be modelled mathematically as follows.

A noise transfer function NTF(z) may be defined as $$\frac{Y(z)}{E(z)},$$

where E(z) is the noise signal introduced by the PWM modulation process. Similarly, a signal transfer function STF(z) may be defined as $$\frac{Y(z)}{X(z)}.$$

It can be shown that $$NTF(z) = \frac{1}{1+G(z)}$$

and $$STF(z) = \frac{G(z)}{1+G(z)}$$

where G(z) is the loop gain.

At low frequencies where the loop gain is very large (i.e. G(z)>>1), NTF(z)≈0 and STF(z)≈1.

Despite the very large oversampling factor relative to the bandwidth of the input signal (sampling at tens of MHz for an audio input signal having a bandwidth of around 20 kHz) and the high loop gain that can be achieved using the architecture illustrated in FIG. 1, the output PWM signal Y(z) is often of insufficient quality for HiFi quality audio. This is at least partly because intermodulation products can arise in the output of the PWM modulator 16 around multiples of the switching frequency of the PWM modulator 16. These intermodulation products lead to unacceptable levels of harmonic distortion in the PWM signal output by the PWM generator 10, even when a feedback loop of the type illustrated in FIG. 1 is employed.

Accordingly, a need exists in the art for a PWM generator that is capable of generating a PWM signal of sufficient quality for use in audio applications.

SUMMARY OF INVENTION

According to a first aspect of the present invention there is provided a pulse-width modulation (PWM) generator for generating a pulse-width modulated signal, the PWM generator comprising: a PWM modulator; and a loop filter, wherein the loop filter is configured to receive an input signal and to output a filtered signal to the PWM modulator, and the PWM modulator is configured to receive the filtered signal from the loop filter and to output a pulse-width modulated signal, the PWM generator further comprising: a feedback loop coupling an output of the PWM modulator to an input of the loop filter, wherein the feedback loop includes a comb filter.

The comb filter used in the present invention attenuates the feedback signal in frequency bands that are involved in generation of intermodulation products, and so has the effect of attenuating any intermodulation products that are present in the output of the PWM generator, thereby improving the quality of the PWM signal generated.

The comb filter may be configured to attenuate components in the output pulse-width modulated signal that occur at multiples of a switching frequency of the PWM modulator.

The PWM generator may further comprise an interpolator for upsampling an input signal and outputting an upsampled input signal to the loop filter The comb filter may have a generally rectangular impulse response.

Alternatively, the comb filter may have a generally triangular or a generally parabolic impulse response.

The PWM generator may further comprise a signal path which is configured to add a delayed and amplified version of a signal output by the comb filter to an input of the PWM modulator.

The signal path may form part of the loop filter.

Alternatively, the signal path may be separate from the loop filter. According to a second aspect of the invention there is provided a class D amplifier comprising a PWM generator according to the first aspect.

The class D amplifier may be an audio amplifier, for example.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
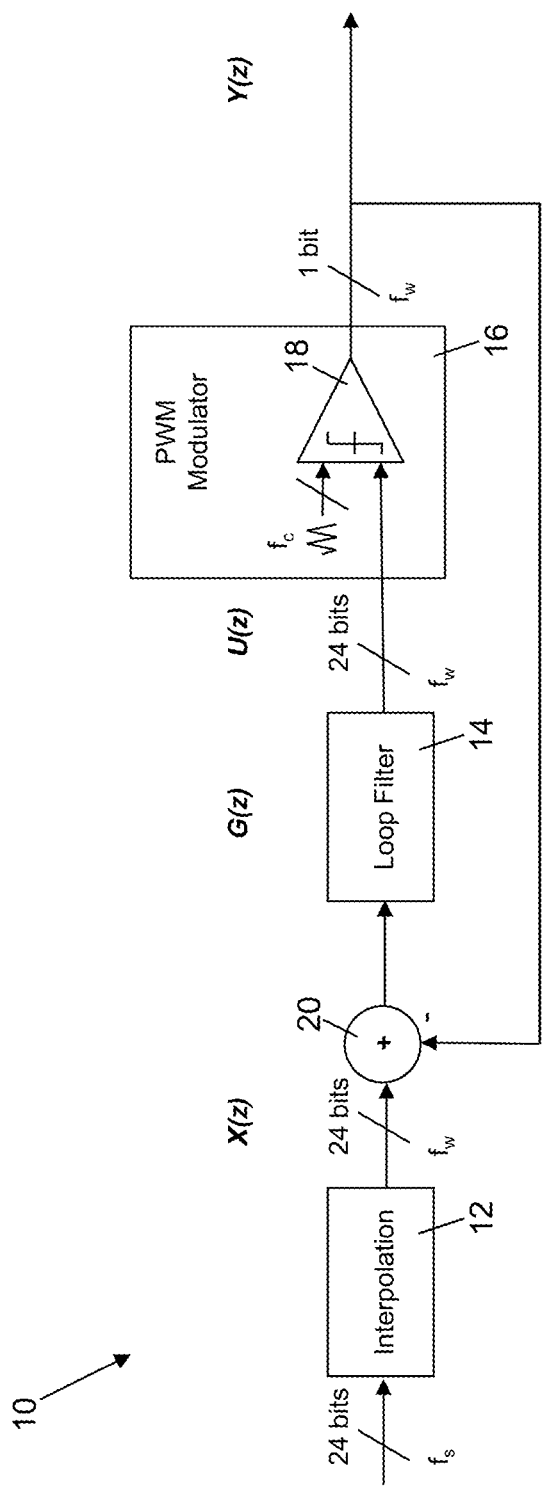
FIG. 1 is a schematic representation of a known pulse-width modulation generator.
Figure 2:
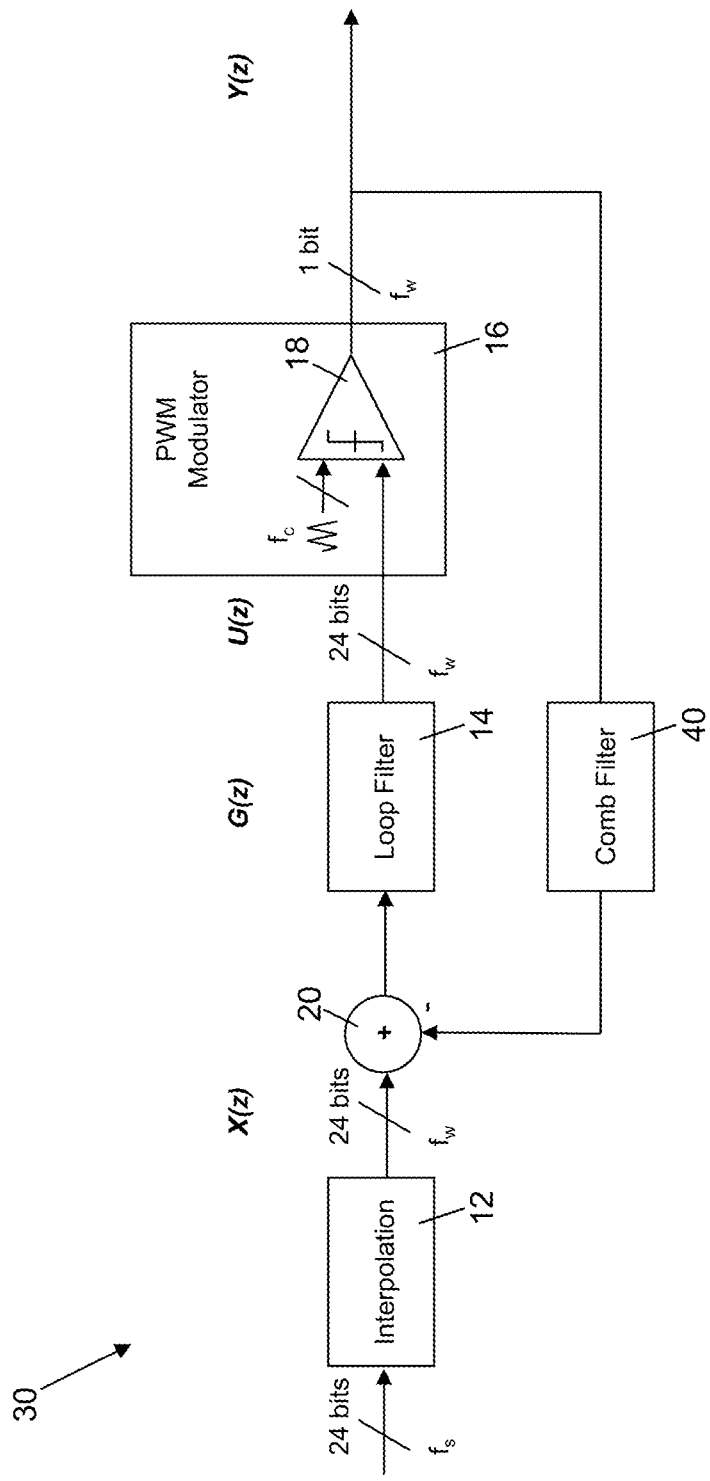
FIG. 2 is a schematic representation of a pulse-width modulation generator.

Referring now to FIG. 2, a pulse-width modulation (PWM) generator is shown generally at 30. The PWM generator 30 shares some common elements with the PWM generator 10 of FIG. 1, and so like reference numerals in FIGS. 1 and 2 refer to like elements. For the sake of clarity and brevity, the schematic representation of FIG. 2 shows only those elements that are required for an understanding of the present invention, but it will be appreciated by those skilled in the art that a physical implementation of the PWM generator 30 may include additional elements. Moreover, the functional blocks illustrated schematically in FIG. 2 are not necessarily representative of physical components that may be present in a physical implementation of the PWM generator 30, but are instead intended to represent the functional elements of the PWM generator 30.

The structure and operation of the PWM generator 30 of FIG. 2 are similar to those of the PWM generator 10 of FIG. 1. Thus, the PWM generator 30 includes an interpolator 12, which receives at its input a digital signal to be modulated, such as a digital audio signal. In the example shown in FIG. 1, the input signal is a 24-bit signal having a sampling frequency $f_s$.

The interpolator 12 upsamples the input signal and outputs a output signal $X(z)$ having a sampling frequency of $f_w$, which is typically in the range of a few tens of MHz, but which may be over 100 MHz, to a loop filter 14, which is a low-pass filter.

The loop filter 14 outputs a filtered output signal $U(z)$ to a PWM modulator 16. The loop filter output signal $U(z)$ is also, in this example, a 24-bit signal having a sampling frequency of $f_w$.

The PWM modulator 16 includes a comparator 18, which compares the signal $U(z)$ input to the PWM modulator 16 with a carrier signal (which is typically a triangle-wave signal for a double-edge PWM modulation or a sawtooth signal for a single edge PWM modulation)of a given frequency, which may be of the order of ten times the highest frequency component of the input signal $X(z)$, and outputs a single-bit pulse-width modulated signal $Y(z)$ having a sampling frequency of $f_w$.

The output of the comparator 18 is binary, and the entire PWM modulation process can be modelled as a quantisation noise source generating a noise signal $E(z)$.

The output signal $Y(z)$ is fed back, via feedback loop, to a combiner 20, where it is subtracted from the interpolated signal $X(z)$ output by the interpolator 12. Unlike in the known PWM generator 10 of FIG. 1, the feedback loop of the PWM generator 30 illustrated in FIG. 2 includes a comb filter 40.

The comb filter 40 is configured to filter out (i.e. remove or substantially attenuate) frequency components of the output signal $Y(z)$ that occur at multiples of the switching frequency of the PWM modulator 16. In this way, the harmonic distortion arising from these signals in the output of the PWM generator 30 can be reduced.

The signal output by the comb filter 40 is input to the combiner 20, which also receives the signal $X(z)$ output by the interpolator. The signal output by the combiner 20 to the loop filter 14 includes a low frequency component, due to the input signal $X(z)$ and the low frequency component of the modulated output signal $Y(z)$, and a high frequency component, due to the high frequency carrier signal component of the modulated signal $Y(z)$. Due to the high gain of the loop filter in the lower frequency ranges and as a result of the feedback loop, the output of the PWM modulator $Y(z)$ only contains the low frequency component of the interpolated input signal $X(z)$ and a shaped error signal with a reduced amount of energy in the low frequency range. As the frequency components of the output signal $Y(z)$ that occur around multiples of the PWM modulator switching frequency have been removed or attenuated by the comb filter 40, those signals do not re-appear, or only appear in a much attenuated form, in the signal $U(z)$ applied at the input of the PWM generator 30, thus reducing intermodulation and harmonic distortion in the output signal and thereby increasing the quality of the PWM signal output by the PWM generator 30.

An important parameter in the PWM generator 30 is the ratio $f_w/f_c$ where $f_c$ is the frequency of the carrier signal used as a reference by the PWM generator 30. For example, if $f_c$=400 kHz and $f_w$=40 MHz, the ratio $f_w/f_c$ is 100, which means that in each PWM switching period comprises 100 samples. As a result, a simple yet effective comb filter 40 which attenuates the signal around all multiples of the switching frequency can be implemented in the form $1+z^{-1}+z^{-2}+\ldots+z^{-(f_w/f_c-1)}$.

In practise the implementation of this filter 40 is very straightforward, since the PWM output Y(z) (which is also the input to the comb filter 40) is a single bit signal. Essentially, the comb filter 40 acts like a sliding window, and within each window counts the number of samples for which the PWM output signal Y(z) is high and the number of samples for which the PWM output signal Y(z) is low, and generates the difference between the two counts. In other words, the filter 40 calculates the average value of the PWM output signal Y(z) over the current window.

In effect, the PWM modulator 16 converts the information contained in the amplitude of the signal U(z) into the time domain, as the information in the PWM output signal Y(z) is essentially encoded in the position of the edges. The comb filter 40 effectively performs the reverse operation, and converts the information contained in the position of the edges of the PWM output signal Y(z) back into an amplitude representation. This process is not fully transparent, however, for a number of reasons. Firstly, there is a delay between the signal U(z) input to the PWM modulator 16 and the signal output by the comb filter 40. Secondly, even taking into account that delay, the amplitude information is not perfectly restored, but the signal produced by the comb filter 40 includes a distortion component, introduced by the PWM modulation itself, which the loop will try to minimise, or at least shape (i.e., push into the high frequency domain, according to the loop filter characteristics).

The comb filter $1+z^{-1}+z^{-2}+ \ldots +z^{-(fw/fc-1)}$ has essentially a rectangular impulse response and only offers limited attenuation around multiples of the switching frequency. Higher attenuation can be obtained, for example by implementing higher order schemes where the same filter is cascaded a number of times, leading to a triangular impulse response, for a filter of the form $(1+z^{-1}+z^{-2}+ \ldots + z^{-(fw/fc-1)})^2$, or to a parabolic impulse response for a filter of the form $(1+z^{-1}+z^{-2}+ \ldots +z^{-(fw/fc-1)})^3$. This however introduces additional delay in the feedback loop, which can give rise to increased risk of stability problems.

The addition of the comb filter 40 in the feedback loop of the PWM generator 30 is a straightforward and cost-effective way of improving the quality of the PWM signal output by the PWM generator 30. Hitherto this solution has not been considered, possibly because the comb filter 40 necessarily introduces a delay in the feedback loop which may jeopardise stability. This issue can be overcome, however, by the use of techniques similar to those employed in, for example, continuous-time sigma-delta analogue to digital converters (ADC) to stabilise the loop if excessive loop delay occurs. These techniques may be implemented in a variety of different ways, but the principle is to introduce additional degrees of freedom (i.e. additional parameters) into the PWM generator 30 to maintain its characteristics compared to the ideal case where there is no delay in the feedback loop. One possible implementation is illustrated in FIG. 3, and is described below.

Figure 3:
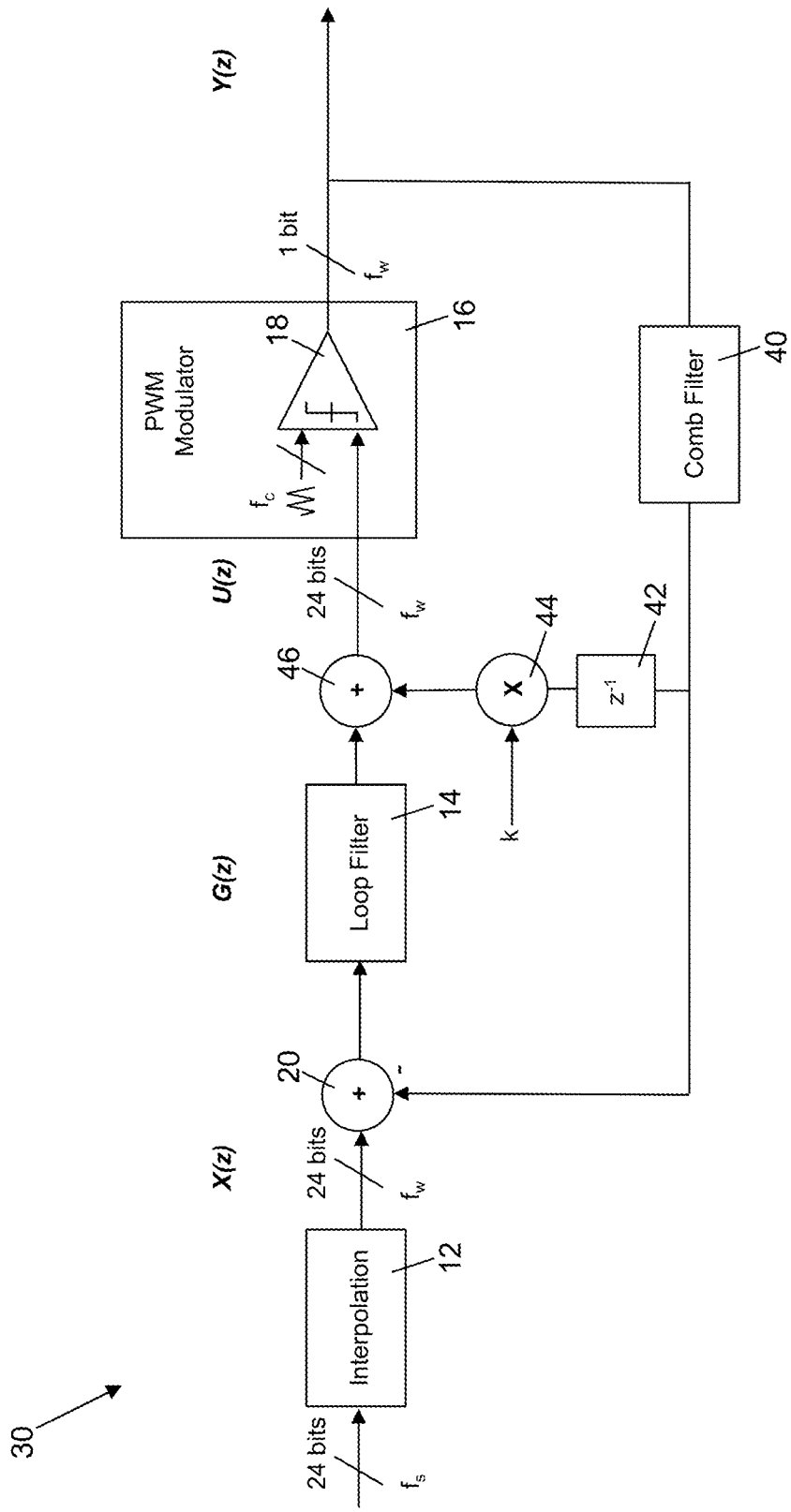
FIG. 3 is a schematic representation of the pulse-width modulation generator of FIG. 2 with an additional signal path.

FIG. 3 schematically illustrates a modification of the PWM generator 30 shown in FIG. 2, in which an additional delay unit 42, a multiplier 44 and an adder 46 are provided as an additional signal path in the PWM generator 30. The delay unit 42 delays samples output by the comb filter 40 and outputs the delayed samples to the multiplier 44, which multiplies the samples by a constant factor k. The multiplier 44 outputs the multiplied samples to the adder 46, which adds the multiplied samples to the output of the loop filter 14, and outputs the combination of the loop filter output and the multiplied samples to the PWM modulator 18. The additional signal path (comprising the delay unit 42, multiplier 44 and adder 46) and its associated gain introduces an extra degree of freedom, so that the delay introduced by the comb filter 40 can be partially compensated for. It will be appreciated that in FIG. 3 the extra path is shown as a separate set of components, but it is equally possible that the delay unit 42, multiplier 44 and adder 46, or functionally equivalent components, could be incorporated into or otherwise form part of the loop filter 14.

Figure 4:
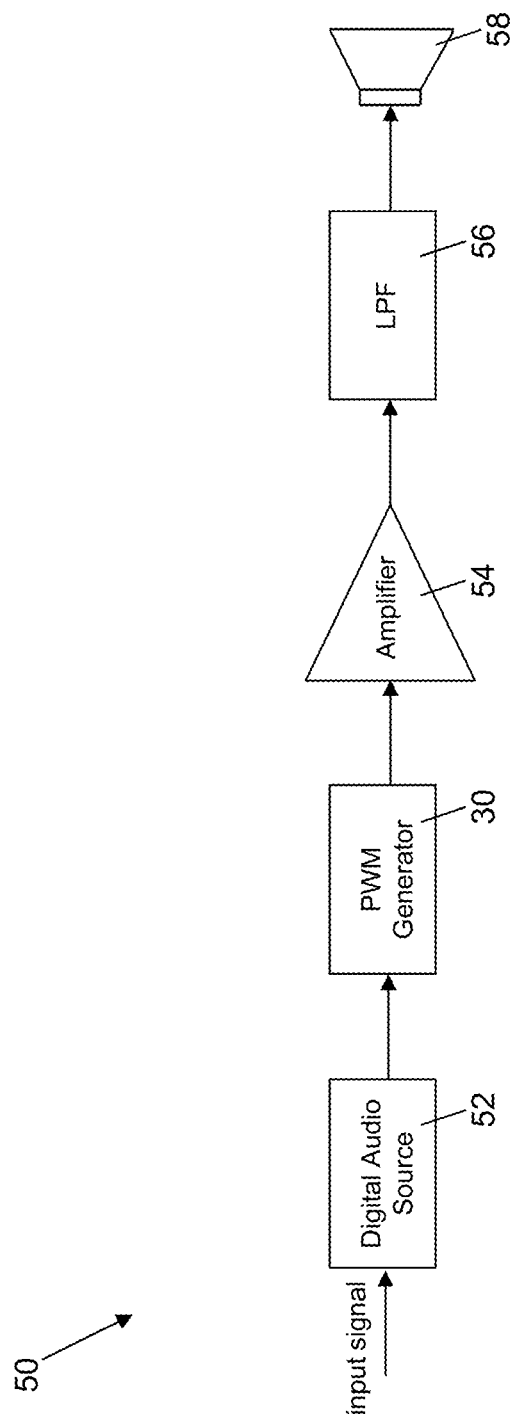
FIG. 4 is a schematic representation of a class D audio amplifier system which uses the pulse-width modulation generator of FIG. 2 or FIG. 3.

The PWM generator 30 illustrated in FIGS. 2 and 3 is suitable for use in a class D amplifier used in audio applications. FIG. 4 is a schematic representation of a possible class D amplifier architecture for use in audio applications.

In the amplifier 50 of FIG. 4, a digital audio input is provided by a digital audio source 52, such as a compact disc player or the like. The digital audio source 52 outputs a digital output signal to the input of the PWM generator 30, which operates as described above with reference to FIG. 2.

The output of the PWM generator 30 is input to an amplification stage 54 comprising one or more amplifiers. The amplification stage is operative to amplify the output of the PWM generator 30 and to output the amplified PWM signal to an input of a low-pass filter 56.

The low-pass filter 56 filters out (i.e. removes or strongly attenuates) the high-frequency carrier signal from the amplified PWM signal, thereby recovering an amplified version of the signal input to the amplifier 50. For optimum efficiency, the low-pass filter 56 is preferably constructed from only inductances and capacitances, without using any resistances other than those associated with the inductances and capacitances (i.e. the low-pass filter is preferably an LC filter rather than an RC or RLC filter), to minimise the amount of power dissipated as heat in resistive components of the low-pass filter 56.

An output of the low-pass filter 56 is connected to an input of an output device such as a loudspeaker 58, which outputs an audio signal based on the output of the low-pass filter 56.

The invention claimed is:

1. A pulse-width modulation (PWM) generator, comprising:
a combiner configured to produce a difference signal by subtracting a feedback signal from an input signal of the PWM generator;
a loop filter configured to filter the difference signal and to produce a filtered signal;
a PWM modulator configured to output a pulse-width modulated signal;
a comb filter configured to produce the feedback signal by filtering the pulse-width modulated signal; and
a signal path configured to add a delayed and amplified version of the feedback signal from the comb filter to the filtered signal from the loop filter to produce an input signal of the PWM modulator.

2. A PWM generator according to claim 1 wherein the comb filter has a generally rectangular impulse response.

3. A PWM generator according to claim 1 wherein the comb filter has a generally triangular impulse response.

4. A PWM generator according to claim 1 wherein the comb filter has a generally parabolic impulse response.

5. A PWM generator according to claim 1 wherein the signal path forms part of the loop filter.

6. A PWM generator according to claim 1 wherein the signal path is separate from the loop filter.

7. A class D amplifier comprising a PWM generator according to claim 1.

8. A class D amplifier according to claim 7, wherein the class D amplifier is an audio amplifier.

9. A PWM generator according to claim 1, wherein the amplification of the signal path is selected to compensate for delay associated with the comb filter.

10. A PWM generator according to claim 1, wherein the PWM modulator includes a comparator configured to compare the input signal of the PWM modulator with a carrier signal at a first frequency.

11. A PWM generator according to claim 10, wherein the comb filter is further configured to filter out frequency components of the pulse-width modulated signal that occur at one or more multiples of the first frequency.

12. A method for generating a pulse-width modulated (PWM) signal, the method comprising:
    subtracting a feedback signal from an input signal to produce a difference signal;
    filtering the difference signal to produce a filtered signal;
    comparing a PWM modulator input signal with a carrier signal at a first frequency to produce a pulse-width modulated signal;
    comb filtering the pulse-width modulated signal to produce the feedback signal;
    delaying feedback signal to produce a delayed feedback signal;
    amplifying the delayed feedback signal by a constant factor to produce a delayed amplified feedback signal; and
    adding the delayed amplified feedback signal to the filtered signal to produce the PWM modulator input signal.

13. A method according to claim 12, wherein the constant factor is selected to compensate for delay associated with the comb filtering.

14. A method according to claim 12, wherein the comb filtering includes filtering out frequency components of the pulse-width modulated signal that occur at one or more multiples of the first frequency.

15. A method according to claim 12, wherein comb filtering the pulse-width modulated signal includes applying a filter having a generally rectangular impulse response.

16. A method according to claim 12, wherein comb filtering the pulse-width modulated signal includes applying a filter having a generally triangular impulse response.

17. A method according to claim 12, wherein comb filtering the pulse-width modulated signal includes applying a filter having a generally parabolic impulse response.

* * * * *